United States Patent [19]

Schmid

[11] 4,287,869
[45] Sep. 8, 1981

[54] CHARGING SYSTEM FOR CUTTING BLADE

[75] Inventor: Frederick Schmid, Marblehead, Mass.

[73] Assignee: Crystal Systems Inc., Salem, Mass.

[21] Appl. No.: 48,712

[22] Filed: Jun. 15, 1979

Related U.S. Application Data

[60] Division of Ser. No. 886,036, Mar. 13, 1978, Pat. No. 4,187,828, which is a continuation-in-part of Ser. No. 767,809, Feb. 11, 1977, Pat. No. 4,092,972.

[51] Int. Cl.³ .................................................. B28D 1/06
[52] U.S. Cl. ...................................... 125/16 R; 51/263; 125/12
[58] Field of Search ................... 125/12, 15, 16 R, 18, 125/21; 51/263

[56] References Cited

U.S. PATENT DOCUMENTS

| | | | |
|---|---|---|---|
| 804,246 | 11/1905 | Miel | 125/18 |
| 2,073,678 | 3/1937 | Broughton | 125/15 |
| 2,368,092 | 1/1945 | Anderson | 125/21 |
| 2,369,068 | 2/1945 | Mentzer | 125/21 |
| 2,691,858 | 10/1954 | Andrus | 51/263 |
| 2,784,536 | 3/1957 | Barron | 125/21 |
| 2,793,478 | 5/1957 | Rohowetz | 125/21 |
| 3,079,908 | 3/1963 | Hunt | 125/17 |
| 3,263,669 | 8/1966 | Ashley | 125/16 |
| 3,452,734 | 7/1969 | Cleland | 125/21 |
| 3,540,427 | 11/1970 | Anderson | 125/21 |

FOREIGN PATENT DOCUMENTS 1138353 10/1962 Fed. Rep. of Germany ........ 125/21

OTHER PUBLICATIONS

Diamond Technology, 2nd edition, article on pp. 45, 46 & 47, Paul Grodzinski.

*Primary Examiner*—Harold D. Whitehead

[57] ABSTRACT

A cutting process in which a blade under tension is moved relative to a workpiece. The blade has a longitudinally-extending abrasive-holding portion defined by blade material that is softer than the workpiece to be cut and overlies a high tensile strength core. The abrasive-holding portion defines a cutting surface extending between opposite sides of the blade and defining less than one-half the total outer surface of the blade, and abrasive particles are partially embedded into a longitudinally-extending segment of the cutting surface but not into the sides of the blade.

14 Claims, 10 Drawing Figures

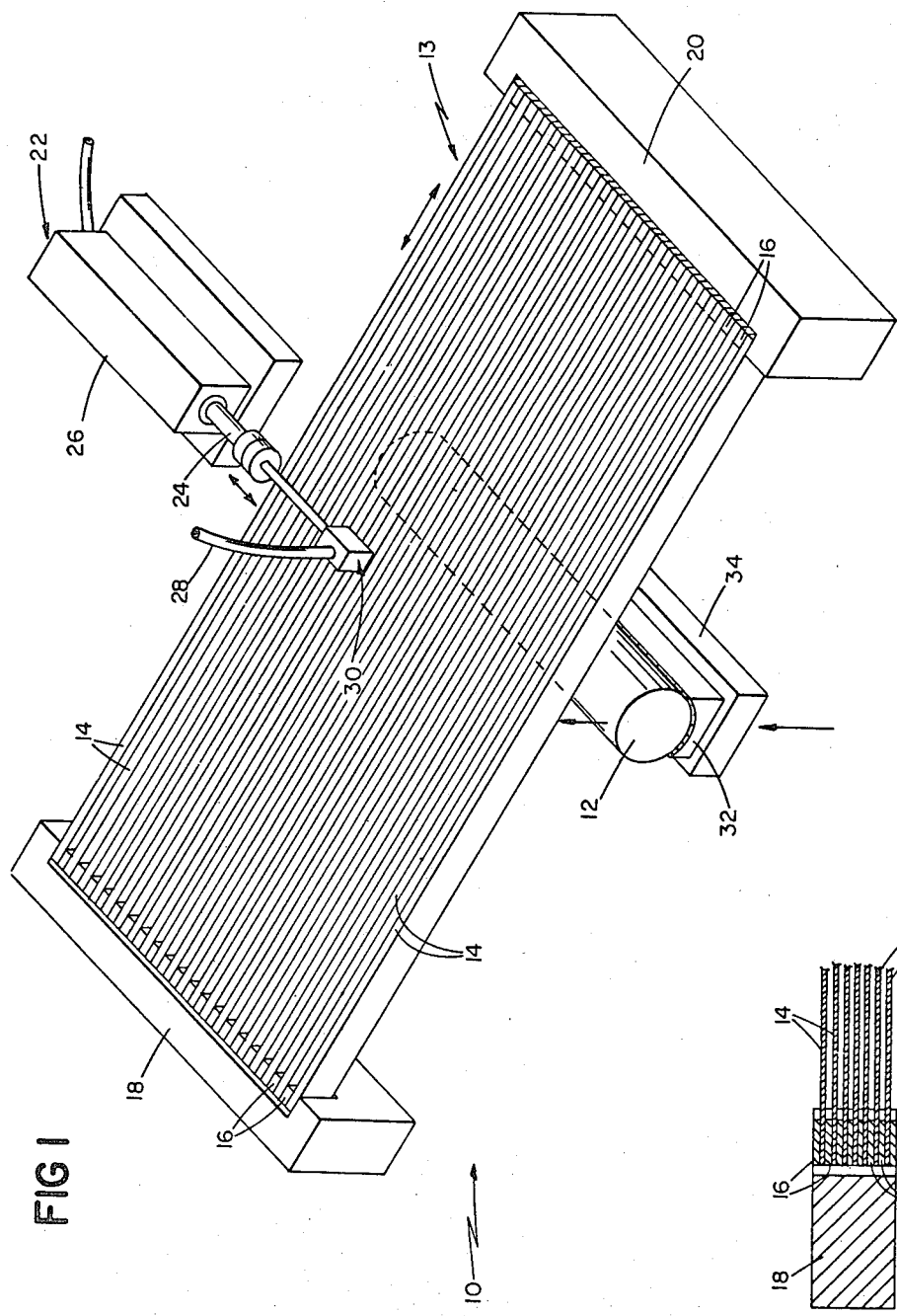

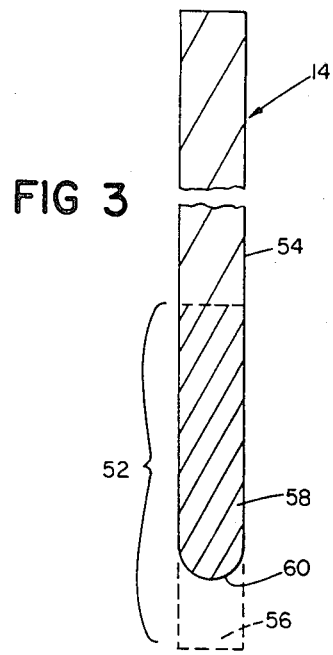
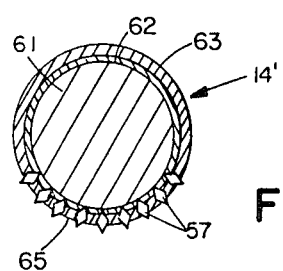
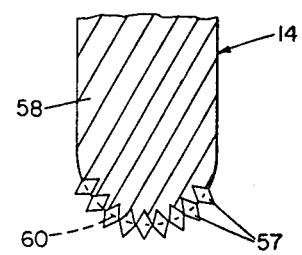
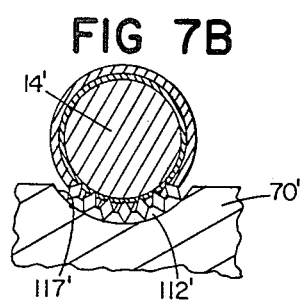
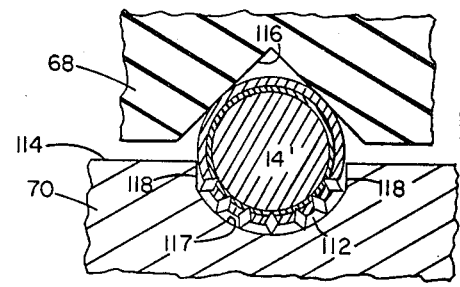
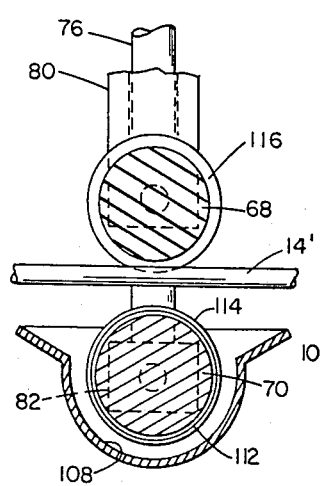
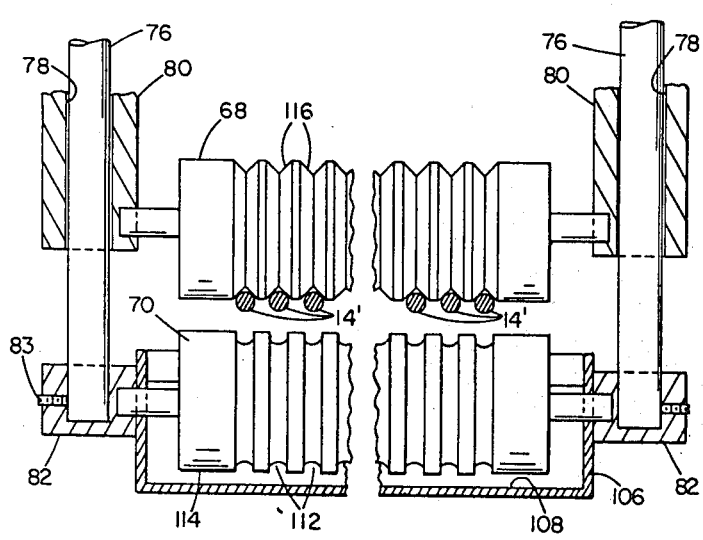

CHARGING SYSTEM FOR CUTTING BLADE

This application is a division of application Ser. No. 886,036, filed Mar. 13, 1978 and now U.S. Pat. No. 4,187,828, issued Feb. 12, 1980, which itself is a continuation-in-part of application Ser. No. 767,809, filed Feb. 11, 1977 and now U.S. Pat. No. 4,092,972, issued June 6, 1978, which prior applications are here incorporated by reference.

This invention relates to cutting materials such as quartz, silicon, sapphire and galium arsenide and, more particularly, to slicing ingots of such materials into thin wafers.

A typical cutting wire used in two-body cutting hard materials comprises a wire having a high strength core covered by an electrolytic copper sheath and impregnated all around with diamond abrasive particles. Such wires have a cutting rate an order of magnitude higher than that in three-body cutting, and produce a kerf (the amount of material removed) that is somewhat narrower. However, the cutting rate is still relatively slow, the kerf is wider than desirable, the blades are quite expensive, the total amount of abrasive present is relatively small, and the abrasive particles pull out or become dull. As in three-bodying cutting, the blades often must be replaced, often in the middle of a cut.

Primary objects of the present invention are to provide a cutting blade and process that have a higher cutting rate, thinner kerf and lower cost per cut than blades and processes heretofore available. Other objects include providing a process that has less chance of blade breakage and less blade wear and requires less blade tension and abrasive.

In one aspect, the invention features a blade having a longitudinally-extending abrasive-holding portion defined by blade material that is softer than the workpiece to be cut and overlies a high tensile strength core, and abrasive particles partially embedded in a longitudinally-extending portion of abrasive-holding portion but not into the sides of the blade. Other aspects are a system for so charging the blade including a charging roll mounted for rotation about its axis and defining an annular groove of width slightly greater than that of the abrasive holding portion of the blade. In preferred embodiments, the abrasive holding portion includes an inner layer into which the abrasive particles are first partially embedded and a second layer deposited over the first after the particles have been so embedded.

Other objects, features and advantages will appear from the following detailed description of the invention, taken together with the attached drawings in which:

FIG. 1 is a simplified view of a cutting machine;

FIG. 2 is a sectional view of a portion of the machine of FIG. 1;

FIGS. 3, 3A and 4 are sectional views of blades used in the machine of FIG. 1; and FIGS. 5, 6, 7, 7A and 7B are views of apparatus for charging blades.

Figure 5:
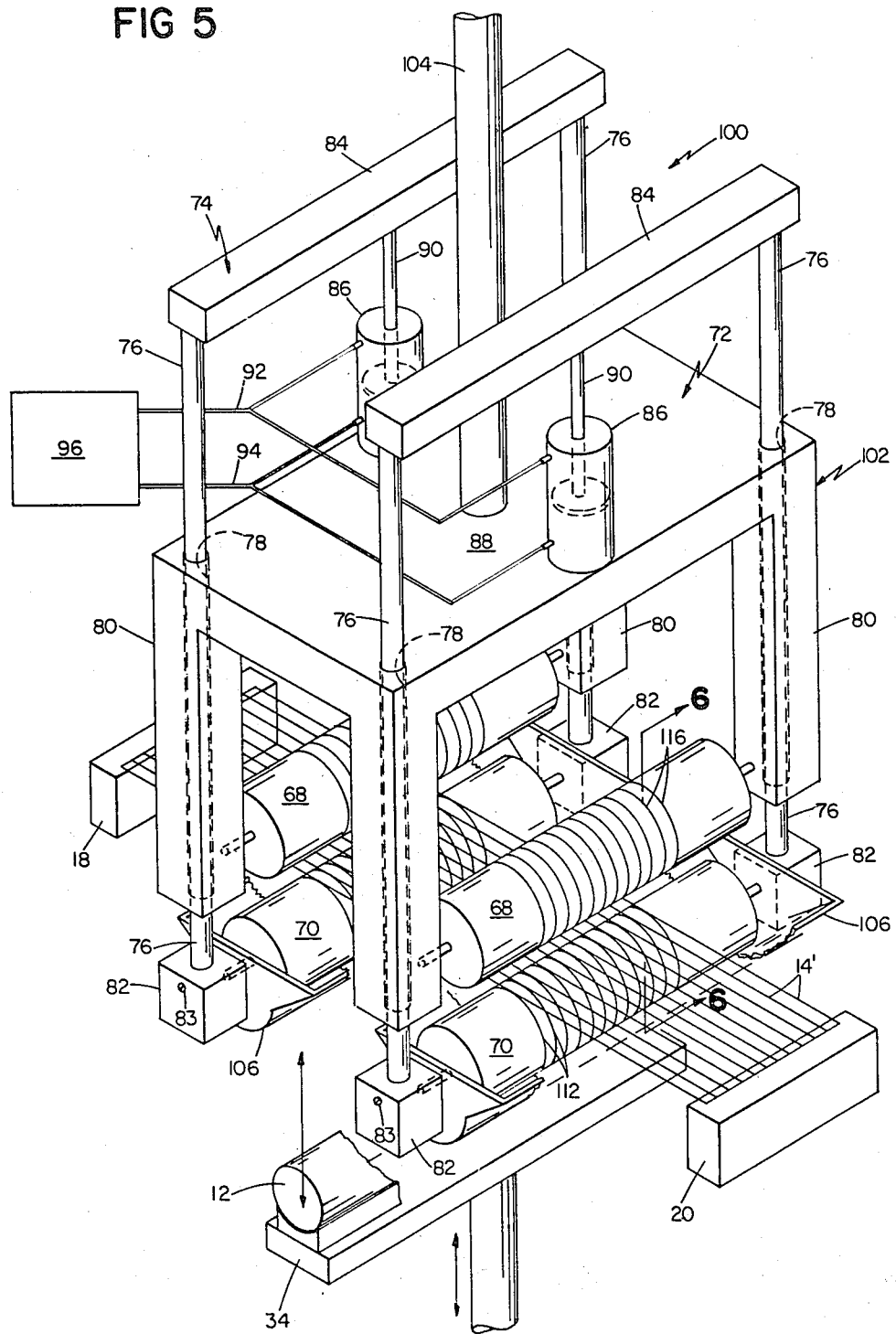

Referring now to FIGS. 1–2 there is shown in simplified form a wafering machine, generally designated 10, for slicing an ingot 12 into thin wafers. Wafering machine 10, as shown, is a conventional machine of the type sold by Varian Associates under the designation "Model 686 Wafering Machine", and was designed primarily for slicing and dicing semiconductor and other brittle materials such as silicon, germanium and quartz. As shown in FIGS. 1 and 2 the machine includes a blade package 13 comprising a plurality of parallel blades 14, separated by spacers 16 and held in tension between a pair of blade holding blocks 18, 20. The blade package 13 is mounted in a blade holding blocks 18, 20. The blade package 13 is mounted in a blade head assembly (not shown) and the entire frame is reciprocated (typically at the rate of 50 to 200 eight inch strokes per minute) by a motor driving a crank disc and connecting rod. The construction of the blade package, blade head assembly driving motor and associated apparatus are described in detail in U.S. Pat. Nos. 3,079,908 and 3,263,669, which are hereby incorporated by reference.

A slurry feed system 22 is mounted at one side of blade package 13, vertically aligned over the ingot 12 to be cut, for feeding an abrasive slurry or cooling fluid over the blades and ingot during cutting. As shown, feed system 22 includes a reciprocating arm 24 which is driven by an air motor 26 back and forth over blade assembly 13, perpendicular to the direction of blade reciprocation. A pump (not shown) supplies the slurry or cutting fluid through hose 28 to a supply head 30 at the end of arm 24, from which it is dripped over the reciprocating blades at the desired rate.

The ingot 12 is cemented to a mounting block 32, typically using Anco brand Improved DeKhotinsky cement, or Eastman 910 brand sold by Eastman Chemical Products, Inc. of Kingsport, Tenn. Mounting block 32 is, in turn, supported on a vertically movable submount 34. A pneumatic feed system (not shown) is attached to submount 34 for feeding ingot 12 upwardly into the reciprocating blades with a desired preset force.

According to the present invention, the blades used in wafering machine 10 are either rectangular blades 14 having the cross-section shown in FIG. 3, or cutting wires 14' having the transverse cross-section shown in FIG. 4.

Referring particularly to FIG. 3, each of blades 14 comprises a commercially available hardened steel blade, typically 3/16 or ½ inch high and 0.002 to 0.015 in. wide of 1095 steel hardened to about 55 $R_c$. The lower edge of the blade is treated to provide a softer (about 35 $R_c$) abrasive-holding portion 52 extending the full length and width of the blade and having a depth of about 400 microns (0.016 in.). The rest of blade 14, i.e., the remaining hardened steel portion, provides a core 54 of high tensile strength. Abrasive-holding portion 52 may comprise either a soft material plated onto the lower edge of blade 14, or a portion of the original commercially available blade that has been softened by heat treating. In either event abrasive particles 57 are partially embedded into the downwardly-facing segment 60 of abrasive-holding portion 52 but not into the sides of the blade so that the overall width of the blade is not increased.

Typically, blade 14 is made by first slightly tempering the structure of a commercially purchased hard steel blade, thereby to soften it as is well known in the metallurgy art. Among the methods satisfactory for heating and tempering the steel along the lower edge of the blade to provide softened edge portion 52 are resistance, induction and electron beam heating. When the edge portion 52 of blade 14 has been so treated, the initial result is a hard outermost skin 56, having a depth of about 50 to 75 microns, overlying a softer section 58 about 400 microns (0.016 in.) deep. A typical profile of the heat treated blade shows the following hardnesses at the indicated depths:

| Depth (Microns) | Hardness $R_c$ |
| --- | --- |
| 25 | 64 |
| 50 | 58 |
| 75 | 47 |
| 100 | 33 |
| 150 | 33 |
| 200 | 37 |
| 250 | 38 |
| 400 | 40 |
| 500 | 43 |

The outer hardened skin 56 is then ground away (typically to a depth of 100 microns to insure it has all been removed) leaving therebelow the desired softer portion having, throughout the desired 400 micron depth, a hardness not greater than about 40 to 45 $R_c$ and, adjacent the outer surface 60, a hardness not greater than about 35 $R_c$. The outer surface 60 of the remaining softer portion 58 is ground into a generally semi-circular in cross-section configuration so that when the blade is put into use there will be no sharp outer edges to be worn away, and abrasive particles are embedded into a central segment of surface 60 subtending an arc of about 120° to 150°.

Alternatively, a plated abrasive holding portion 52 is made by electrolytically or electrolessly depositing a soft materail such as copper or nickel onto the hard steel core 54 of blade 14. The soft material is deposited to a depth of 0.001 in. to 0.002 in. on the lower edge of the commercially purchased blade and upwardly along the blade's outer sides to a height of about 1/16 inch. Plated rectangular blades may be somewhat less satisfactory than such blades in which the soft portion is formed by heat treating since plating adds to the overall width of the blade (and thus increases the kerf width) and because a substantial depth of plating is required if the lower edge of the blade is to be ground into the usually desired semi-circular cross-section.

The cutting wire 14' of FIG. 4 has a central core 61 of high tensile strength plated with two soft peripheral layers 62, 63 of, typically, copper or nickel, and having a total thickness of between 0.0055 in. and 0.001 inches. The overall thickness of the layers 62, 63 depends on the size of the abrasive particles 57 embedded therein, and should not be less than about half or more than about three-fourths the nominal size of those particles. Thus, for example, when 45 micron particles are used, the thickness of layer 62 should not be less than about 0.001 inches. The diameter of the core, typically of stainless or high tensile strength steel, is usually in the range of 0.002 to 0.015 inches. As with blade 14, the particles 57 are embedded in the downwardly facing lower surface 65 and not into the sides of the blade.

As previously indicated, two major causes of blade wear are particle pull-out and dulling of the abrasive. In cutting processes in which the latter is the principal cause, core 61 may be plated with a single soft peripheral layer having the same overall thickness as double layer 62, 63.

In cutting of materials such as silicon, however, abrasive particle pull-out is a greater cause of blade wear than is dulling of the abrasive, and it is often desirable to plate the blade with outer layer 63 after the particles 57 already have been embedded in place in inner layer 62. For example, a wire 14' for cutting silicon will first be plated to provide (or purchased with) a copper or nickel sheath 62 having a thickness of about one-fourth the nominal particle size. Then, after the abrasive particles have been embedded in place, the outer layer 63 will be deposited over the inner layer, bringing the total thickness of the two layers to a depth equal to about three-fourths the particle size. If the second layer plated is deposited using electroless nickel, the material can be heat treated from 200° to 750° to cause it to densify and harden, thereby holding the abrasive particles even more tenaciously in place.

In any event, the blades 14 or cutting wires 14' can be mounted in the blade package 13 at the proper blade tension, in the manner known to those skilled in the art, and the abrasive particles then charged into them using the apparatus 100 illustrated in FIGS. 5–7.

The abrasive particles themselves should be irregular in shape and have a large number of sharp edges. A diamond-shape has been found particularly satisfactory. If the particles are too flat, they may lie flat and not become embedded in the blades. Similarly, blocky abrasives, such as $B_4C$, tend to roll between a blade and workpiece or charging element rather than dig into the soft blade outer surface. For cutting very hard materials such as sapphire, the most satisfactory abrasive has been found to be diamond, either natural or the artificial products made by General Electric Co. or E. I. duPont. When cutting softer materials such as silicon, other abrasives such as $Al_2O_3$, $Al_2O_3$—$ZrO_2$ eutectic, cubic boron nitride and SiC may be used. The particular abrasive material and the size of the abrasive particles will depend, as is known to those skilled in the art, on the material to be cut, the desired cutting speed, the smoothness of cut desired, and the acceptable kerf width. Hard workpieces naturally require use of harder abrasives. For smooth cuts and thinner kerfs, smaller abrasive particles should be used. For cutting thin wafers from sapphire ingots, 30, 45 and 60 micron diamond abrasive particles have proved most satisfactory.

To keep the kerf width as small as possible, the abrasive particles should not project beyond the outer edges of the blade or wire, except of course as necessary to provide blade clearance. Thus, as shown in FIGS. 3 and 4, the abrasive particles are not charged into the entire downwardly-facing semi-circular in transverse cross-section surfaces of blade 14 and wire 14'. Rather, the portions of surface 60 of blade 14 adjacent the side of the blade are free of abrasive particles, as are the corresponding portions of the lower semi-circular surface 65 of wire 14', thus keeping the effective overall width to a minimum. In each instance, the portion of the blade or wire into which particles are charged is generally symmetrical about a vertical plane and subtends a downardly-facing arc of less than 180°. The exact size of the arc will, of course, depend on the size of the abrasive particles. Small particles may be charged into surface portions more closely adjacent the sides of the blade or wire without increasing its overall width than can large particles.

The apparatus 100 for charging the abrasive particles into the blade includes a frame 102 mounted on machine 100 by support column 104. The frame carries two pairs of parallel, horizontal rollers, one pair being positioned on each side of workpiece 12 and each roller being mounted for rotation about its respective axis. Each pair includes one hard elastomeric (typically nylon) roller and one rigid (typically steel roller). In the illustrated embodiment, hard elastomeric support rollers 68 are mounted above and engage the tops of blades 14 and steel charging rollers 70 are positioned below the blades 14.

Frame 102 includes a fixed (relative to machine 10) portion 72 to which support column 104 and support rollers 68 are attached, and a vertically movable portion 74 supporting charging rollers 70. The movable portion 74 comprises four vertical rods 76 each depending downwardly through a bore 78 in a vertical leg 80 of fixed position 72, a roller support block 82 fixed by set screws 83 to the bottom end of each rod 76, a pair of cross-beams 84 each connecting the upper ends of the pair of rods 78 associated with each of support rollers 68, and a pair of pneumatic cylinders 86 each having the cylinder thereof secured to base plate 88 of fixed portion 72 and the piston rod 90 thereof fixed to a respective one of cross-beams 84. Each of charging rollers 70 is supported for rotation about its axis on a pair of blocks 82. Pneumatic control lines 92, 94 connect cylinders 86 to a pneumatic controller, generally designated 76. As will be evident, application of fluid under pressure through lines 94 will cause cylinders 86 to force beams 84 upwardly, drawing charging rollers 78 upwardly against blades 14 and towards support rollers 78. Charging rollers 70 can be moved down, away from blades 14 and support rollers 70, by venting lines 94 and applying fluid under pressure to lines 92.

Each charging roller 70 has a plurality of axially-spaced circumferential grooves 112 in its outer periphery 114, as shown in FIGS. 6 and 7. A generally semicircular in transverse cross-section trough 106 is mounted on blocks 82 coaxially with a respective one of rollers 70 so that the lower half of the roller is within the trough with the periphery 114 of the roller spaced about 1/16 in. from the inner surface 108 of the trough. As shown in FIG. 6, the overall length of each trough 106 is slightly greater than that of the respective roller 70, and the trough is closed at its ends. For purposes of clarity, the grooves in rollers 70 (and in roller 68 as described hereinafter) are not shown in FIG. 5.

The axially-spaced circumferential grooves 112 in the periphery of each roller 70 are each perpendicular to the roller axis and regularly spaced at intervals equal to the distance between adjacent ones of the blades 14 or 14′ mounted in blade package 13. As shown most clearly in FIG. 7A each groove 112 is generally semicircular in cross-section, including an arcuate base 117 and a pair of parallel flat sides 118. The radius of base 117 is equal to that of the outer surface soft abrasive-holding portion of the blades (surface 60 of blades 14 and surface 65 of blades 14′) plus the nominal size of the abrasive particles. Thus, the grooves whose base 117 have a radius of about 0.0022 in. are used to load 60 micron abrasive particles into a blade 14, 14′ having an overall width of 0.004″.

To control the portion of the bottom of the respective blade or wire into which abrasive particles are embedded, the overall width of the grooves, i.e., the distance between sides 118, is only slightly greater than that of the blade 14 or wire 14′ per se (and less than twice the sum of the radius of the abrasive-holding portion and the nominal size of the abrasive particles). When the blade is fitted within the grooves, sides 118 insure that abrasive particles are embedded only in the desired downwardly facing portion of the blade or wire; no particles are embedded in the blade sides where they would project outwardly and undesirably increase its effective overall width. The overall depth of the grooves 12 is about the same as the radius of the semicircular lower surface 60, 63 of the blade abrasive-holding portion.

FIG. 7B illustrates a slightly modified roll 70′ and groove 112. As shown, groove 112′ is identical to the portion of groove 112 radially within groove sides 118. Thus, groove 112′ includes an arcuate in transverse cross-section base 117′ having a radius equal to, or slightly less than, that of the outer surface of the abrasive-holding portion of wire 14′ plus the nominal size of the abrasive particles, and subtending an arc, typically about 120°–150°, equal to that of the longitudinally-extending portion of the blade into which the abrasive-holding particles are to be embedded. The radius and less-than-180° arc of the groove base insures that particles will not be embedded into the sides of the blade.

When cutting with wires 14′, it is desirable that each of support rollers 68 also include a plurality of axially-spaced circumferential grooves 116, each of which is arranged to receive the upper portion of a respective wire 14′ or blade 14. As shown most clearly in FIG. 7A, each of grooves 116 is V-shaped in transverse cross-section, and thus prevents both vertical and horizontal displacement of the wire or blade. Together, the support rollers 68 on each side of and closely adjacent blade 112 greatly reduce blade wander during cutting. When cutting with rectangular in cross-section blades 14 rather than wires 14′, grooves 116 may be rectangular rather than V-shaped (or semi-circular as may be desirable for wires) in cross-section; and the rectangular blades should have a relatively low height to width ratio to avoid blade twisting. If blade wander is not a serious problem, grooves 116 may be eliminated.

As will be evident, each support roller 68 forces the blades hard against its associated charging roller 70. The elasticity of one of each pair of rollers (the support roller as illustrated) allows for dimensional variation in the diameter or height of the blades, wires, and abrasive particles. When the charging roller is elastomeric, the elastomeric deformation is often sufficient to eliminate the need for grooves 112.

To charge the abrasive particles 57 into blades 14 or wire 14′, troughs 106 are filled with an abrasive paste or thick slurry i.e., a mixture of abrasive particles in a carrier consisting of a fluid, paste, or thick oil. A diamond abrasive paste found to be useful is Grade 45 Diamond-Die Compound (sold by Hyprez Division of Engis Corporation, Morton Grove, Ill.) diluted with Hyprez Hyprelube (sold by the same company). Charging system 100 is positioned as shown with the top of each of blades 14, 14′ bearing against support rollers 68 and, if the support rollers are grooved, fitted into a respective one of support roller grooves 116. Pneumatic cylinders 86 are then pressurized through lines 94 at the pressure needed to drawing charging rollers 70 up against the bottom of blades 14, 14′ with the desired charging force. The lower portion of each of blades 14, 14′ fits into one of grooves 102 of each of charging rollers 70; the top of each blade bears against support rollers 68 which insure that the blades do not buckle.

The blade head assembly is then reciprocated relative to the rollers, all the while forcing the blades and rollers towards each other with sufficient force to charge (i.e., partially embed) the abrasive particles into the soft peripheral portions of the blades. Typically, the force used to charge the blades is in the range of 2 to 10 times the force that will later be used during cutting. For example, when the abrasive is diamond and the finished blade will be used to cut sapphire at a cutting force of about four ounces per blade, the force used in charging may be in the range of eight to forty ounces per blade. The exact force required will be determined empirically and depends on the particular abrasive and blade being used. Preferably, the force used is that necessary to embed the abrasive particles 57 about half way into the soft outer portion of the blades. In the case of blade 14', the depth to which the particles 57 can be embedded is limited by the thickness of the soft outer layers 62, 63.

As should be apparent, the abrasive particles can be embedded into each blade 14 at any desired concentration (particles per unit area). For higher particle concentrations, the concentration of abrasive particles in the abrasive paste or slurry in trough 74 is made higher, and the blade head is reciprocated relative to the roller 64 a greater number of times.

As noted before, abrasive particles are embedded only in those portions of the blades that will actually later be used in cutting a workpiece. There are no particles embedded in the sides and top of the blades. This not only makes for efficient use of expensive diamond abrasive particles but, since abrasive is not fixed in the blade sides, reduces kerf width and the amount of material consumed in slicing. Both these effects are extremely important to a commercially acceptable operation.

During cutting of the workpiece 12 in machine 10, an abrasive free cooling fluid such as water and ethylene glycol, rather than an abrasive slurry, is dripped over the blades from the machine's slurry feed system 22. Charging rollers 70 are moved (by introduction of fluid under pressure to cylinders 86 through lines 92) to a position spaced a short distance below blades 14, 14'. The upward pressure of workpiece 12 keeps the blades 14, 14' within the grooves 116 of support rollers 68, thereby maintaining the axial positioning of the blades relative to the workpiece and greatly reducing blade wander.

Although the present invention has been described with reference to a wafering machine having reciprocating wire or other blades, it should be evident that it can also be employed with other types of blades and cutting machines. For example, continuous bandsaw blades of the general type sold by Dia-Chrome, Inc. of Glendale, Calif., or long wire blades of the type sold by Laser Technology, Inc. may be treated to provide a relatively soft abrasive-holding edge portion and then charged with abrasives, all as previously described herein. The continuous bandsaw blades may, typically, be used in a bandsaw machine such as the Zepher model available from Do-All Company of Des Plaines, Ill.; the long wire saw blades may be used in a wide range of wire saws such as those available from Laser Technology, Inc. of which the "Guillotine" model 2008 is the largest.

Other embodiments will be within the scope of the following claims.

What is claimed is:

1. A system for charging abrasive particles into a blade including a longitudinally-extending abrasive-holding portion as said blade is moved in a direction generally parallel to its length, said system comprising:
a charging roll mounted for rotation about an axis generally perpendicular to the direction of movement of said blade and including an annular groove having a width slightly greater than the width of said abrasive-holding portion and less than the sum of said width of said abrasive holding portion plus twice the nominal size of said particles, whereby said blade may be charged by positioning said abrasive-holding portion in said groove and embedding said particles into the portion of said abrasive-holding portion facing the base of said groove.

2. The system of claim 1 wherein said charging roll includes a plurality of regularly spaced annular grooves, each of said grooves having a width slightly greater than the width of a said abrasive-holding portion of a said blade.

3. The system of claim 1 wherein said groove has an arcuate base subtending an arc of less than 180° and extending the width of said groove.

4. The system of claim 3 wherein said arc is in the range of about 120° to about 150°.

5. The system of claim 1 or claim 3 wherein the portion of said blade into which said particles are to be charged defines in transverse cross-section an arc, and the radius of the arcuate base of said groove is greater than that of said arc of said portion and less than the sum of that of said arc of said portion and the nominal size of said particles.

6. The system of claim 1 wherein said groove has a pair of sides generally perpendicular to the axis of said roll, and the width of said groove is less than the sum of the width of said abrasive-holding portion of said blade plus twice the nominal size of the said abrasive particles to be embedded therein.

7. The system of claim 1 including a support roll mounted with its axis parallel to that of said charging roll and its periphery spaced slightly from that of said charges roll whereby said support roll will engage the side of said blade opposite said charging roll.

8. The system of claim 7 including means for moving said charging and support rolls relative to each other in a direction generally perpendicular to their axes and to the direction of movement of said blade relative to said charging roll.

9. The system of claim 7 wherein said support roll is elastomeric.

10. The system of claim 7 wherein said support roll and said charging roll each include a plurality of axially-spaced annular grooves each aligned with a respective groove of the other.

11. The system of claim 7 including two of said support rolls and two of said charging rolls mounted in respective pairs.

12. The system of claim 1 wherein said groove has an arcuate base subtending an arc of less than 180 degrees and a pair of sides generally perpendicular to the axis of said wall.

13. A system for charging abrasive particles into a blade including a longitudinally-extending abrasive-holding portion as said blade is moved in a direction generally parallel to its length, the portion of said blade into which said particles are to be charged defining in traverse cross-section an arc, and said system comprising:
a charging roll mounted for rotation about an axis generally perpendicular to the direction of movement of said blade and including an annular groove having an arcuate base subtending an arc of less than 180 degrees and extending the width of said groove, the radius of said arcuate base of said groove being greater than that of said arc of said portion and less than the sum of that of said arc of said portion and the nominal size of said particles, whereby said blade may be charged by positioning said abrasive-holding portion in said groove and embedding said particles into the portion of said abrasive-holding portion facing the base of said groove.

14. The system of claim 13 wherein said arc subtended by said base is in the range of about 120 degrees to about 150 degrees.

* * * * *